United States Patent
Kimura et al.

(10) Patent No.: US 11,460,690 B2
(45) Date of Patent: Oct. 4, 2022

(54) LIGHT SCANNING APPARATUS AND METHOD OF CONTROLLING LIGHT SCANNING APPARATUS

(71) Applicants: Yuji Kimura, Tokyo (JP); Takayuki Kurokawa, Tokyo (JP)

(72) Inventors: Yuji Kimura, Tokyo (JP); Takayuki Kurokawa, Tokyo (JP)

(73) Assignee: MITSUMI ELECTRIC CO., LTD., Tokyo (JP)

( * ) Notice: Subject to any disclaimer, the term of this patent is extended or adjusted under 35 U.S.C. 154(b) by 22 days.

(21) Appl. No.: 16/910,552

(22) Filed: Jun. 24, 2020

(65) Prior Publication Data
US 2021/0003840 A1    Jan. 7, 2021

(30) Foreign Application Priority Data
Jul. 1, 2019  (JP) ............................. JP2019-122798

(51) Int. Cl.
*G02B 26/08* (2006.01)
*H02N 2/00* (2006.01)
*G01S 7/4861* (2020.01)
*G02B 26/10* (2006.01)

(52) U.S. Cl.
CPC ........ *G02B 26/0858* (2013.01); *G01S 7/4861* (2013.01); *G02B 26/10* (2013.01); *H02N 2/0075* (2013.01)

(58) Field of Classification Search
None
See application file for complete search history.

(56) References Cited

U.S. PATENT DOCUMENTS

| | | | | |
|---|---|---|---|---|
| 2008/0278784 A1* | 11/2008 | Abe | ..................... | G02B 26/105 359/199.1 |
| 2008/0316560 A1* | 12/2008 | Kandori | .............. | G02B 26/105 359/199.1 |
| 2012/0242191 A1 | 9/2012 | Aimono | | |
| 2016/0142687 A1* | 5/2016 | Chevallaz | .............. | G09G 3/346 359/199.3 |

FOREIGN PATENT DOCUMENTS

JP    2012-198415    10/2012

* cited by examiner

*Primary Examiner* — Jennifer D. Carruth
(74) *Attorney, Agent, or Firm* — IPUSA, PLLC

(57) ABSTRACT

A light scanning apparatus includes a light source configured to intermittently emit light based on an irradiation timing signal; a mirror configured to reflect the light emitted by the light source; an actuator configured to cause the mirror to be deflected based on drive signals; a sensor configured to output a signal according to deflection of the mirror; an irradiation timing adjusting-unit configured to adjust the irradiation timing signal based on the output signal of the sensor; and an irradiation timing storage configured to store the adjusted irradiation timing signal.

8 Claims, 10 Drawing Sheets

1A

LIGHT SCANNING APPARATUS AND METHOD OF CONTROLLING LIGHT SCANNING APPARATUS

CROSS-REFERENCE TO RELATED APPLICATION

This application claims priority under 35 U.S.C. § 119 to Japanese Patent Application No. 2019-122798, filed Jul. 1, 2019, the contents of which are incorporated herein by reference in their entirety.

BACKGROUND OF THE INVENTION

1. Field of the Invention

The present disclosure relates to a light scanning apparatus and a method of controlling the light scanning apparatus.

2. Description of the Related Art

Conventional one-dimensional or two-dimensional light scanning apparatuses are known to scan with laser light, while causing a mirror to oscillate about one or more axes, the mirror being formed using a MEMS (Microelectromechanical systems) technology (see, e.g., Japanese Patent No. 5659056, which is hereinafter referred to as Patent document 1). Such a light scanning apparatus is applied to a device for measuring distances and ranging of an object, which utilizes laser light used in a LiDAR (Light Detection and Ranging). The light scanning apparatuses in the MEMS system are expected to be applied to the LiDAR used in automotive driving, or the like.

In such a light scanning apparatus, the laser light is emitted at regular time intervals by a light source, toward the mirror, in order to irradiate an object with the laser light, at equal spaces. The mirror of the light scanning apparatus is driven in a non-resonant drive system using, for example, drive voltages each having a triangular waveform.

SUMMARY

According to the techniques described below, a light scanning apparatus includes a light source configured to intermittently emit light based on an irradiation timing signal; a mirror configured to reflect the light emitted by the light source; an actuator configured to cause the mirror to be deflected based on drive signals; a sensor configured to output a signal according to deflection of the mirror; an irradiation timing adjusting-unit configured to adjust the irradiation timing signal based on the output signal of the sensor; and an irradiation timing storage configured to store the adjusted irradiation timing signal.

DESCRIPTION OF THE EMBODIMENTS

Related art information relevant to the present disclosure recognized by the inventors of this application will be provided below. In a non-resonant drive system of a mirror by piezoelectric elements, a deflection amount of the mirror according to drive voltages does not easily change linearly and exactly. As a result, the deflection amount changes non-linearly. For this reason, for example, with respect to a scanning system such as a LiDAR that, at regular intervals, transmits and receives laser light encompassing a certain range of scanning angles, dot positions where laser light is radiated deviate from respective theoretical positions due to the described non-linearity, which may result in variation in spacing between adjacent dot positions. The deviation of the dot position reduces the detection accuracy of the LiDAR.

In order to prevent the deviation of the dot positions, a sensor (see Patent document 1) for measuring deflection (inclination angle) of the mirror is provided, and the laser irradiation operation is controlled while the sensor output is checked.

However, in such a control method, a control is required to be taken such that a threshold for each dot position is set, such that the sensor output is compared with the threshold, and such that laser irradiation is performed every time the value of the sensor output exceeds the threshold. Therefore, detection accuracy cannot be ensured unless a plurality of thresholds are set.

Additionally, the determination operation in which a given threshold is referenced is required to be performed at high speed and in real time, and thus there may be a problem in that jitter is generated in the signal used in the sensor or an analog circuit of a later stage of the sensor, and in that the jitter results in variation in a given dot position.

In view of the above situation, an object of the technique according to the embodiments in the present disclosure is to allow for accurate adjustment of dot positions in a simple control.

First Embodiment

Hereinafter, a first embodiment of the present disclosure will be described with reference to the drawings.

Figure 1:
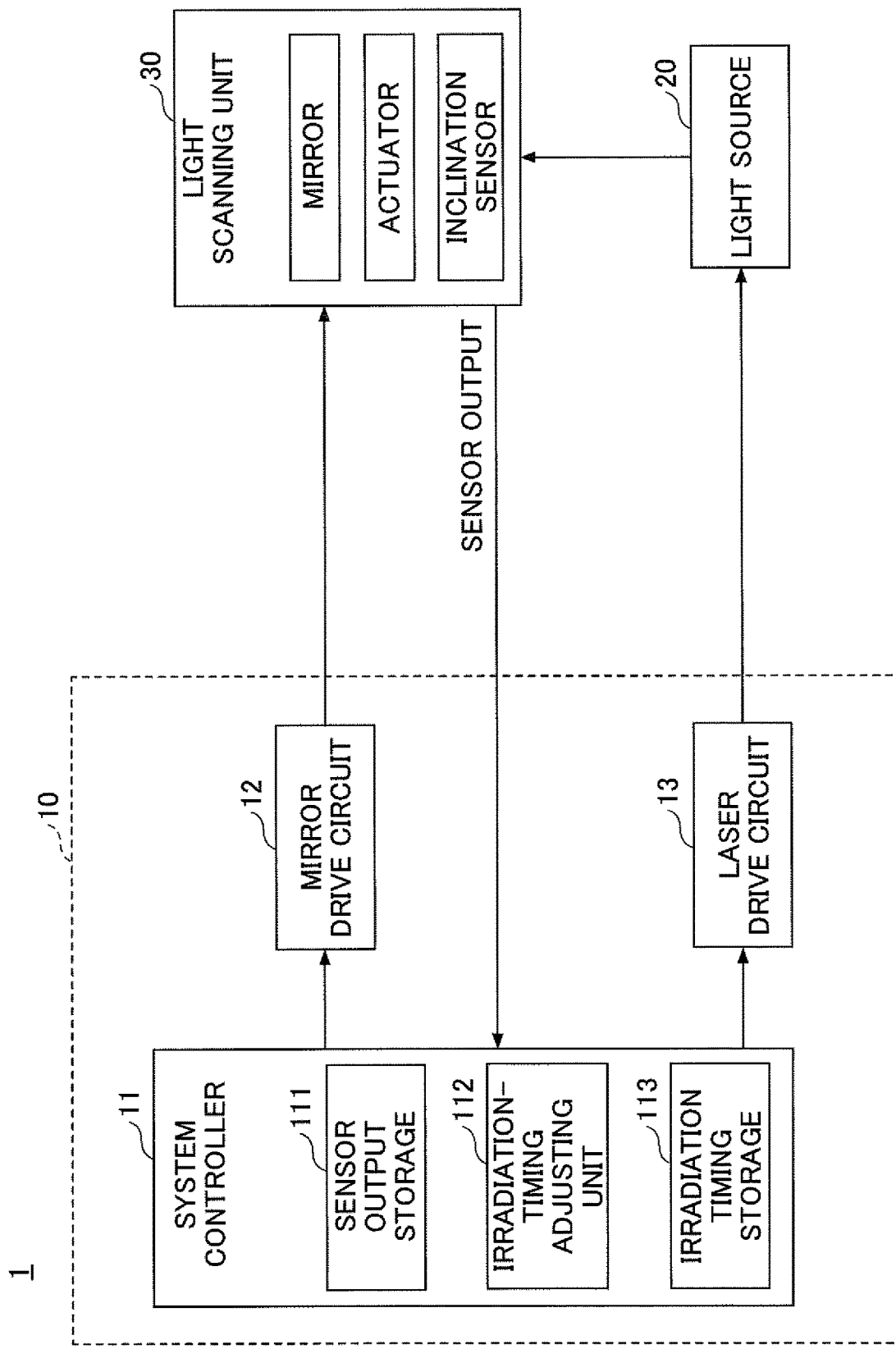
FIG. 1 is a diagram illustrating an example of the configuration of a light scanning apparatus according to a first embodiment.

FIG. 1 is a diagram illustrating an example of the configuration of a light scanning apparatus according to the first embodiment. As illustrated in FIG. 1, the light scanning apparatus 1 includes a light scanning controller 10, a light source 20, and a light scanning unit 30. Each component will be described below.

The light scanning controller 10 includes a system controller 11, a mirror drive circuit 12, and a laser drive circuit 13. The light scanning controller 10 controls the light source 20 and the light scanning unit 30.

The system controller 11 supplies, to the mirror drive circuit 12, a control signal for controlling the oscillation of a mirror provided in the light scanning unit 30. Further, the system controller 11 supplies an irradiation timing signal for emitting laser light, to the laser drive circuit 13.

The mirror drive circuit 12 is a mirror drive unit that supplies, to the light scanning unit 30, a drive signal (drive voltage) for causing the mirror described below to oscillate about predetermined axis, based on the control signal from the system controller 11.

The laser drive circuit 13 supplies a laser drive signal for driving a laser, to the light source 20, based on the irradiation timing signal supplied by the system controller 11.

The light source 20 includes one or more laser diodes, and the like. The light source 20 emits laser light intermittently at a timing that is determined based on the laser drive signal supplied by the laser drive circuit 13. The laser light emitted by the light source 20 enters the light scanning unit 30.

The light scanning unit 30 causes the mirror to oscillate about a predetermined axis, in accordance with the drive signal supplied by the mirror drive circuit 12. Thereby, the light scanning unit 30 varies a direction of light reflected with respect to emitted laser light, while scanning with the laser light.

The system controller 11 includes a CPU (Central Processing Unit) as an arithmetic processing unit; a RAM (Random-Access Memory) as a temporary storage unit; a flash memory as a non-volatile storage unit; and the like. The system controller 11 includes a sensor output storage 111; an irradiation-timing adjusting unit 112; and an irradiation timing storage 113, which are functional units.

The sensor output storage 111 stores the output signal (sensor output) of a deflection sensor that detects deflection of the mirror provided in the light scanning unit 30. For example, the deflection sensor may be an inclination sensor that measures an inclination angle of the mirror. The irradiation-timing adjusting unit 112 adjusts the irradiation timing signal based on the sensor output stored in the sensor output storage 111. The irradiation timing storage 113 stores the irradiation-timing signal adjusted by the irradiation-timing adjusting unit 112. Each component will be described below in detail.

Figure 2:
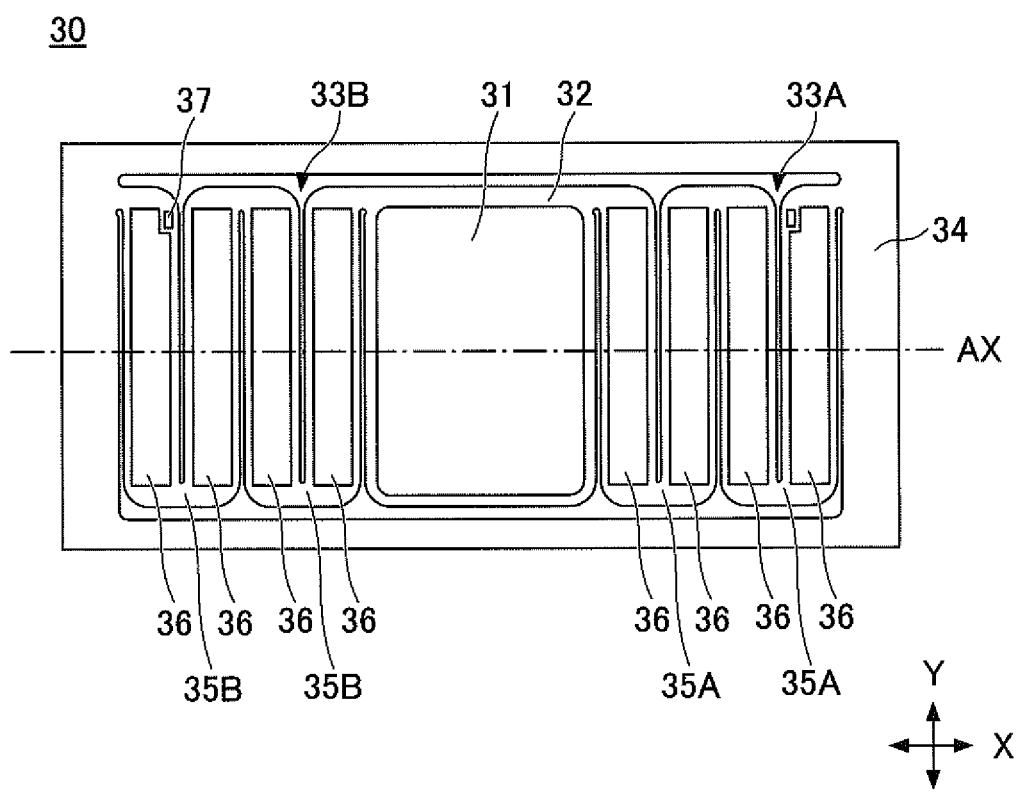
FIG. 2 is a diagram illustrating an example of a light scanning unit.

FIG. 2 is a plan view of an example of an upper face side of the light scanning unit 30. Note that in FIG. 2, the interconnects and terminals are omitted.

The light scanning unit 30 includes the mirror 31; a mirror support 32; drive beams 33A and 33B; and a fixing frame 34. The mirror 31 is provided on the surface of the mirror support 32. In FIG. 2, the axis AX represents an oscillation axis of the mirror 31. A direction parallel to the oscillation axis AX is referred to as an X direction, and a direction perpendicular to the oscillation axis AX is referred to as a Y direction.

A pair of drive beams (33A and 33B) is connected on each side of the mirror support 32. The drive beam 33A includes a plurality of vertical beams each of which has a rectangular shape and extends in the Y direction. End portions of each drive beam pair having adjacent vertical beams are coupled to each other at a given turn portion 35A, and the drive beam 33A has a bellows construction in which the vertical beams are zigzagged as a whole. One end portion of the drive beam 33A is connected to the inner of the fixing frame 34, and another portion of the drive beam 33A is connected to the outer periphery of the mirror support 32. Similarly, the drive beam 33B includes a plurality of vertical beams each of which has a rectangular shape and that extend in the Y direction. End portions of each pair having adjacent vertical beams are coupled to each other at a given turn portion 35B, and the drive beam 33B has a bellows construction in which the vertical beams are zigzagged as a whole. One end portion of the drive beam 33B is connected to the inner of the fixing frame 34, and another portion of the drive beam 33B is connected to the outer periphery of the mirror support 32.

With respect to the drive beams 33A and 33B, a drive source 36 including a piezoelectric element is disposed on each vertical beam. The piezoelectric element that constitutes the drive source 36 includes a piezoelectric thin film; an upper electrode formed on the piezoelectric thin film; and a lower electrode formed on the lower surface of the piezoelectric thin film. With respect to each of the drive beams 33A and 33B, when drive voltages set at reversed polarities are respectively applied to the drive sources 36 provided for adjacent vertical beams, the adjacent vertical beams deflect vertically in opposite directions. Thereby, the resultant force caused by the vertically deflected vertical beams is applied to the mirror support 32, so that the mirror 31 oscillates about the oscillating axis AX.

In such a manner, the drive beams 33A and 33B cause the mirror 31 to oscillate about the oscillating axis AX, and serve as an actuator that scans with laser light reflected by the mirror 31. Note that the drive voltage applied to each drive source 36 has a triangular waveform, and the mirror 31 is driven in a non-resonant drive system.

The light scanning unit 30 also includes an inclination sensor 37 for measuring an inclination angle (deflection amount) of the mirror 31 in the Y direction, while the mirror 31 is oscillating. The inclination sensor 37 includes a piezoelectric sensor, and is disposed, for example, on a given vertical beam. The piezoelectric sensor that constitutes the inclination sensor 37 includes an upper electrode formed on an upper surface of a piezoelectric thin film; and a lower electrode formed on the lower surface of the piezoelectric thin film. The inclination sensor 37 outputs a signal indicating the inclination angle of the mirror 31.

The light scanning unit 30 is formed using, for example, an SOI substrate in which a support layer, a buried oxide layer (BOX layer), and a silicon active layer are laminated. The fixing frame 34 has a triple-layer construction of the support layer, the BOX layer, and the silicon active layer. Each of the mirror support 32 and the drive beams 33A and 33B has a single-layer construction of the silicon active layer, or a dual-layer construction of the BOX layer and the silicon active layer.

Figure 3A:
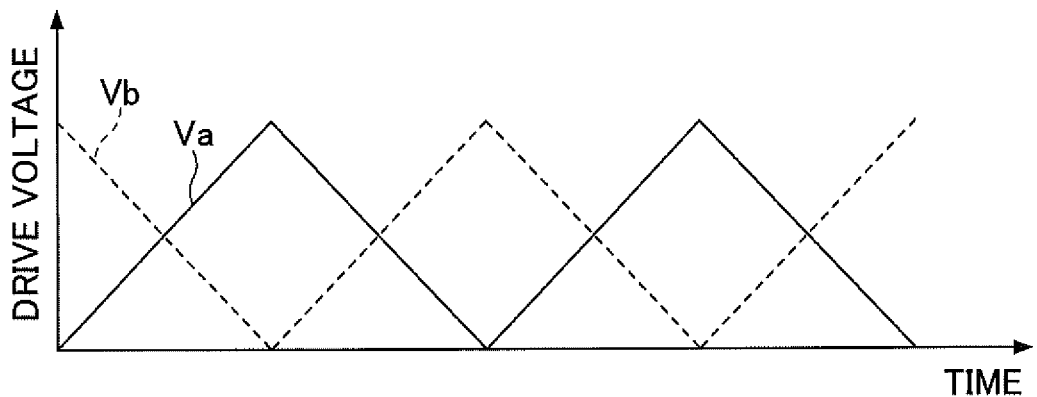
FIGS. 3A to 3C are diagrams illustrating an example of the relationship with respect to drive voltages, the laser output, and the sensor output.
Figure 3B:
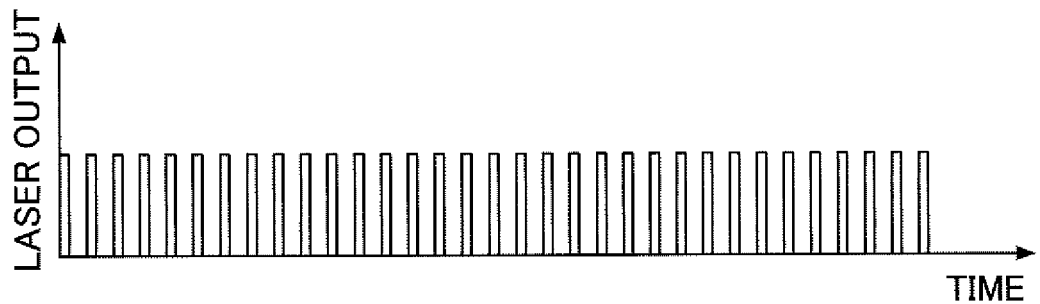
Figure 3C:
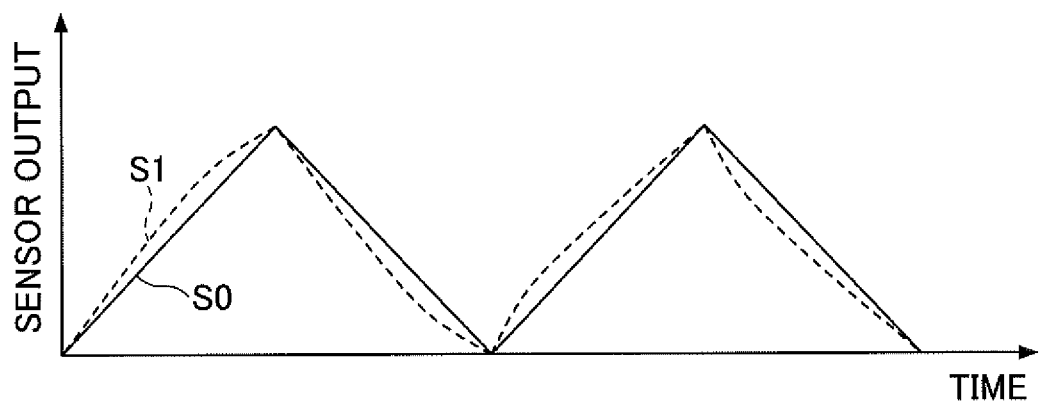

FIGS. 3A to 3C illustrate the relationship with respect to the drive voltages, the laser output, and the sensor output. FIG. 3A illustrates the drive voltages supplied by the mirror drive circuit 12 to the light scanning unit 30. The waves Va and Vb represent triangular waves that are applied to adjacent drive sources 36, and of which phases are inverted with respect to each other.

FIG. 3B illustrates the laser output of the light source 20, into the light scanning unit 30. Note that FIG. 3B illustrates the initial laser output in a case where the irradiation timing is not adjusted by the described irradiation-timing adjusting unit 112. The laser is emitted intermittently, and the time interval of the laser being initially emitted is constant.

FIG. 3C illustrates the output signal (sensor output) of the inclination sensor 37 in a case where the mirror 31 is driven based on the drive voltages illustrated in FIG. 3A. The line S0 represents the theoretical sensor output when reflection of the mirror 31 according to the drive voltage is assumed to change linearly. The line S1 represents the sensor output when reflection of the mirror 31 according to the drive voltages changes non-linearly. In practice, the sensor output changes non-linearly, as represented by the line S1, because the reflection of the mirror 31 includes non-linear reflection.

Figure 4:
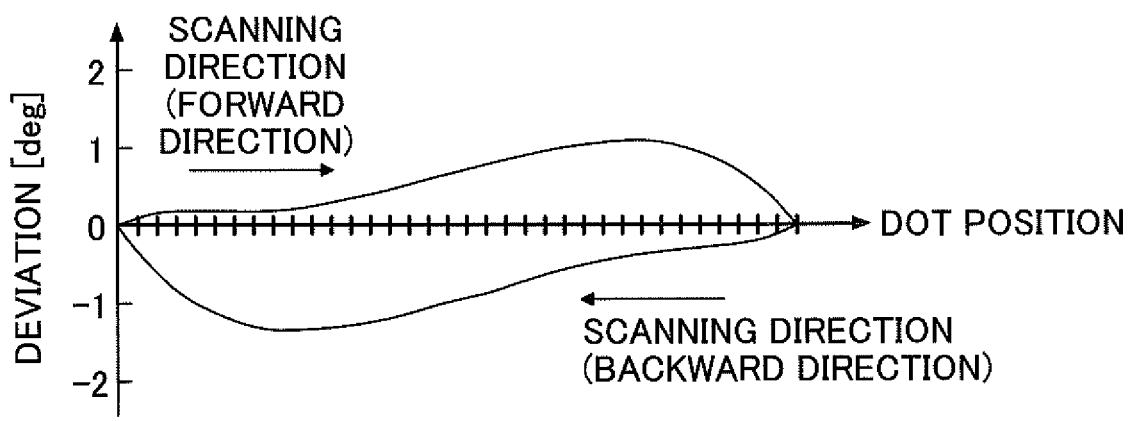
FIG. 4 is a diagram illustrating deviation from theoretical values for dot positions.

In such a manner, when reflection of the mirror 31 changes non-linearly and the time interval of the laser emission is constant, positions (dot positions) of dots where laser light is radiated by the light scanning unit 30 are not equally spaced, which results in variations in the positions. FIG. 4 is a diagram illustrating an example of deviation from theoretical values for the dot positions. For example, when the mirror 31 oscillates at inclination angles in the range of −40° to +40°, in a case where laser light is radiated in increments of 0.1° in the above range, the number of dot positions is 801. In this case, for example, when a shift of about ±1° is assumed to occur with respect to a given dot position, in a case where laser light is radiated toward a location corresponding to the inclination angle of the mirror 31 being 0°, the laser light may actually be delivered to a location with deviation of about ±1°.

Figure 5:
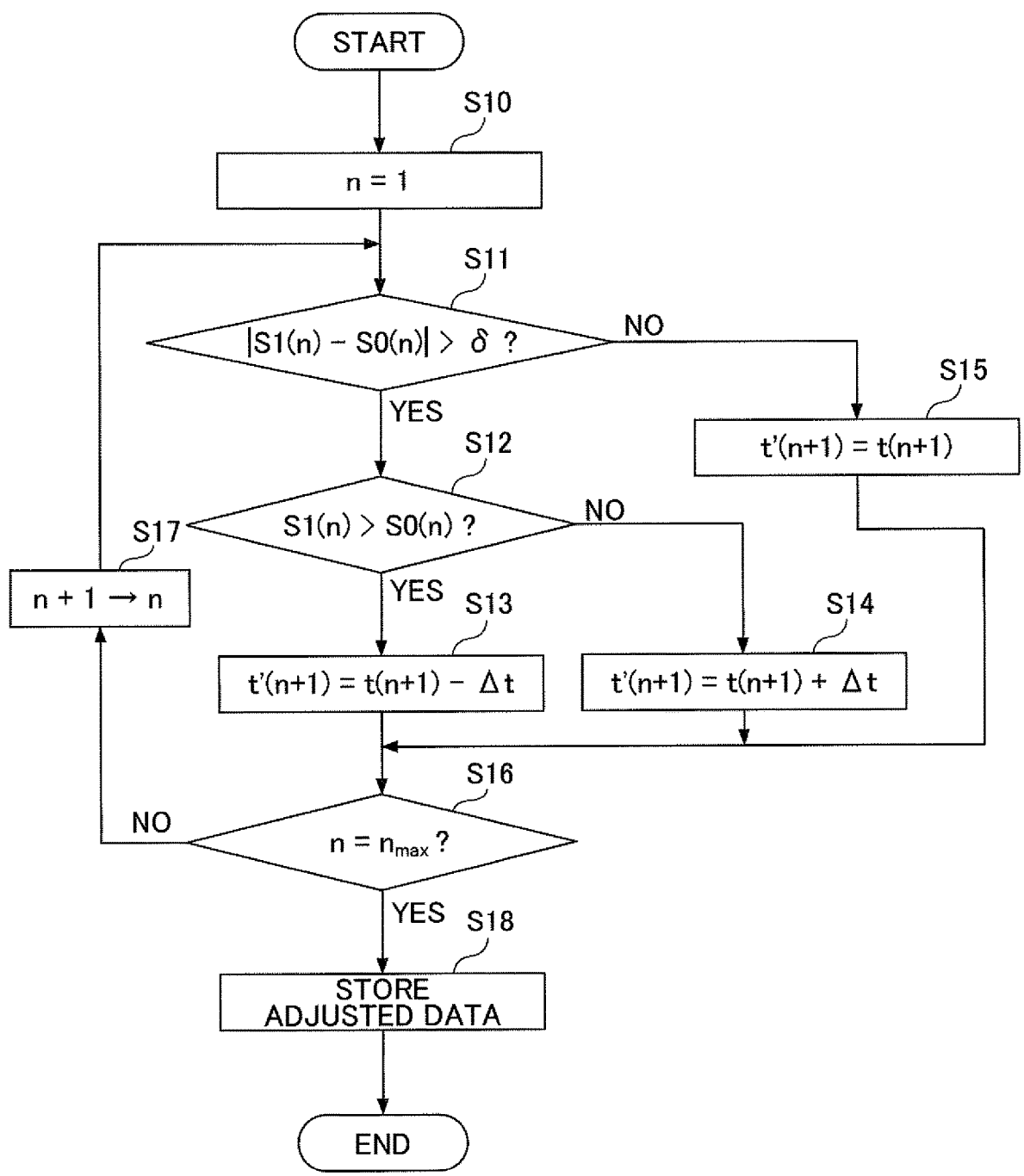
FIG. 5 is a flowchart for explaining an example of an adjustment process of an irradiation timing signal.
Figure 6:
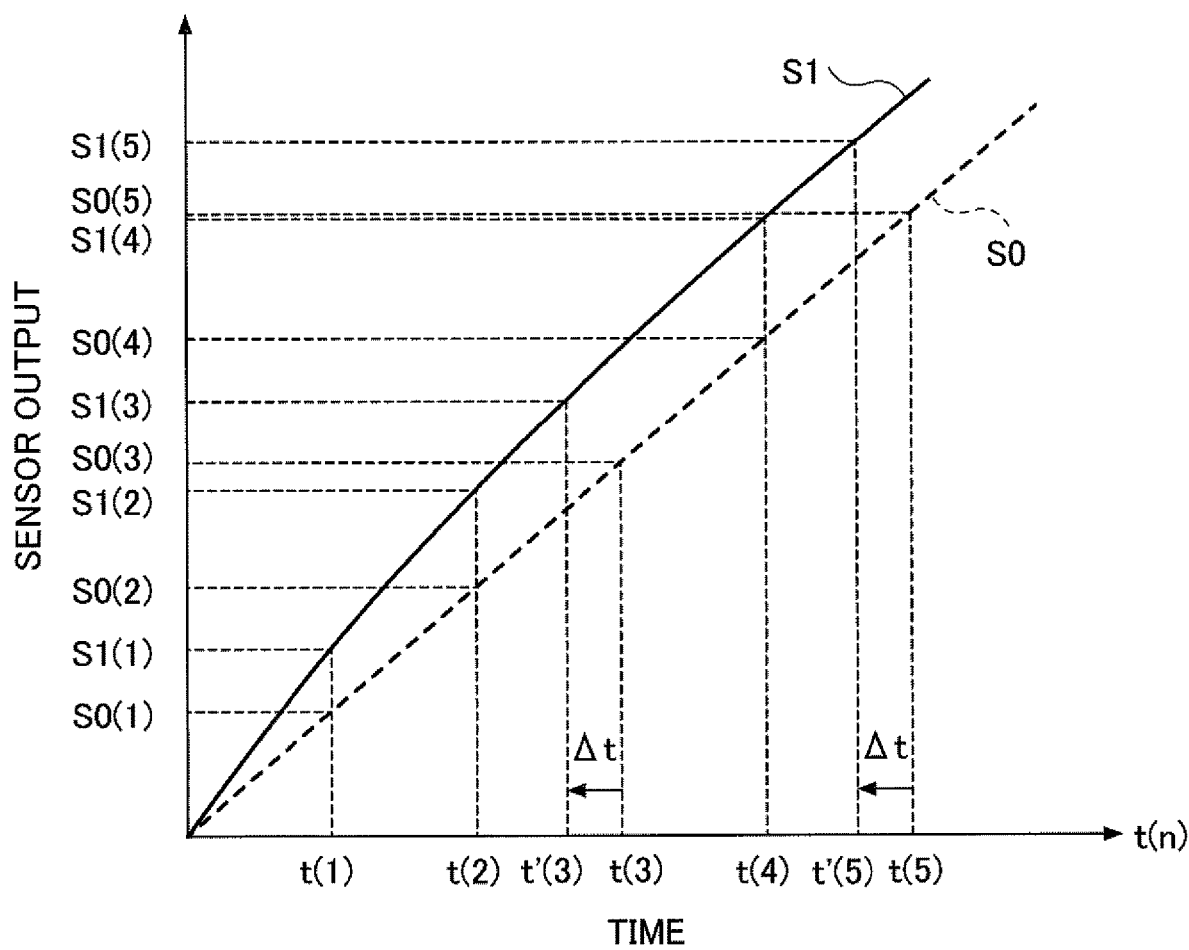
FIG. 6 is a diagram illustrating a specific example of irradiation timing adjusted in the adjustment process.

Hereafter, an adjustment process of the irradiation timing signal by the irradiation-timing adjusting unit. 112 will be described. FIG. 5 is a flowchart illustrating an example of the adjustment process of the irradiation timing signal. FIG. 6 is a diagram illustrating a specific example of the irradiation timing adjusted in the adjustment process.

The irradiation-timing adjusting unit 112 adjusts the irradiation timing signal based on the sensor output that is set during at least one oscillation period, and that is stored in the sensor output storage 111. When the light scanning apparatus 1 is not in operation, the adjustment process is automatically started upon a determination that an instruction from a user; or a predetermined condition is satisfied.

As illustrated in FIG. 5, when the adjustment process starts, the irradiation-timing adjusting unit 112 first sets the parameter n to "1" (step S10). The parameter n expresses a positive integer corresponding to a given dot position. In the following description, the time at which scanning is performed with respect to a dot position n (the time at which laser light is radiated) is given as t(n).

Then, the irradiation-timing adjusting unit 112 determines whether an absolute value of a difference between the sensor output $S1(n)$ at time t(n) and the theoretical sensor output $S0(n)$ at time t(n) is greater than a predetermined threshold δ (step S11). Note that the sensor output $S1(n)$ indicates a signal value that is output from the inclination sensor 37 in the case where scanning is performed with respect to the dot position n, and that is stored in the sensor output storage 111. The sensor output $S0(n)$ indicates a theoretical value when the reflection of the mirror 31 is assumed to change linearly, the theoretical value being determined by calculation.

When an absolute value of the difference between the sensor output $S1(n)$ and the sensor output $S0(n)$ is determined to be greater than a threshold δ (YES in step S11), the irradiation-timing adjusting unit 112 determines the magnitude of the difference between the sensor output $S1(n)$ and the sensor output $S0(n)$ (step S12).

When "$S1(n)>S0(n)$" (YES in step S12), the irradiation-timing adjusting unit 112 sets a value obtained by subtracting a predetermined value Δt from an initial time t(n+1) for a dot position n+1, as an adjusted time t'(n+1) for the dot position n+1 (step S13). In contrast, if "$S1(n)≤S0(n)$" is satisfied (NO in step S12), the irradiation-timing adjusting unit 112 sets a value obtained by adding a predetermined value Δt to an initial time t(n+1) for a dot position n+1, as an adjusted time t'(n+1) for the dot position n+1 (step S14). Where, the predetermined value Δt is a fixed value that corresponds to less than the time interval with respect to the initial time t(n).

In step S11, when an absolute value of the difference between the sensor output $S1(n)$ and the sensor output $S0(n)$ is determined to be less than or equal to a threshold δ (No in the step), the irradiation-timing adjusting unit 112 sets "t'(n+1)=t(n+1)", without adjusting the time interval based on a predetermined value Δt for a time t(n+1) (step S15).

After performing any one step of steps S13 to S15, the irradiation-timing adjusting unit 112 determines whether the parameter n indicates a maximum value (the last dot position in one oscillation period) $n_{max}$ (step S16). When "$n<n_{max}$" (No in step S16), the irradiation-timing adjusting unit 112 adds "1" to the parameter n (step S17) and returns the process to step S1. Note that when adjustment is performed in step S13 or S14, the calculation process in step S1 is performed using the sensor output $S1(n)$ corresponding to the adjusted time t'(n).

In step S16, if "$n=n_{max}$" is satisfied, that is, when the adjustment process during one oscillation period is completed (YES in the step), the irradiation-timing adjusting unit 112 stores the time t(1) and the adjusted time t'(n) (where n=2 to $n_{max}$) in the irradiation timing storage 113, by using the irradiation timing signal (step S18), and then the adjustment process is finished.

Until the described adjustment process starts again, the laser drive circuit 13 causes the light source 20 to emit laser light based on the adjusted the irradiation timing signal stored in the irradiation timing storage 113.

The adjustment process will be described in more detail with reference to FIG. 6. In FIG. 6, at time t(1), if the condition "$|S1(1)-S0(1)|≤δ$" is satisfied, "t'(2)=t(2)" is set without performing adjustment at time t(2). Then, at time t(2), if the conditions "$|S1(2)-S0(2)|>δ$" and "$S1(2)>S0(2)$" are satisfied, adjustment is performed so that "t'(3)=t(3)−Δt." is set. Then, at time t(3), if the condition "$|S1(3)-S0(3)|≤δ$" is satisfied, "t'(4)=t(4)" is set without performing adjustment at time t(4). Then, at time t(4), if the conditions "$|S1(4)-S0(4)|>δ$" and "$S1(4)>S0(4)$" are satisfied, adjustment is performed so that "t'(4)=t(4)−Δt" is set.

As described above, the light scanning apparatus 1 according to the present embodiment adjusts the irradiation timing signal based on the difference between the measured value and the theoretical value of the sensor output, and causes the light source 20 to emit the laser light at the timing adjusted based on the adjusted irradiation timing signal. Thereby, the deviation from the theoretical value for a given dot position can be reduced. Further, with respect to the light scanning apparatus 1 according to the present embodiment, the light source 20 is driven based on the previously adjusted irradiation timing signal. Thereby, a real-time control in which a target position of laser light being radiated is determined while the sensor output is checked, is not required. Accordingly, generation of a jitter or the like can be prevented.

First Modification of the First Embodiment

Hereafter, a first modification of the embodiment will be described. According to the embodiment described above, when the absolute value of the difference between the measured value and the theoretical value of the sensor output is greater than or equal to the threshold, the adjustment is performed by adding or subtracting a predetermined value with respect to the irradiation-time interval. In the modified embodiment, the irradiation-time interval is adjusted using a value corresponding to the difference between the measured value and the theoretical value of the sensor output.

Figure 7:
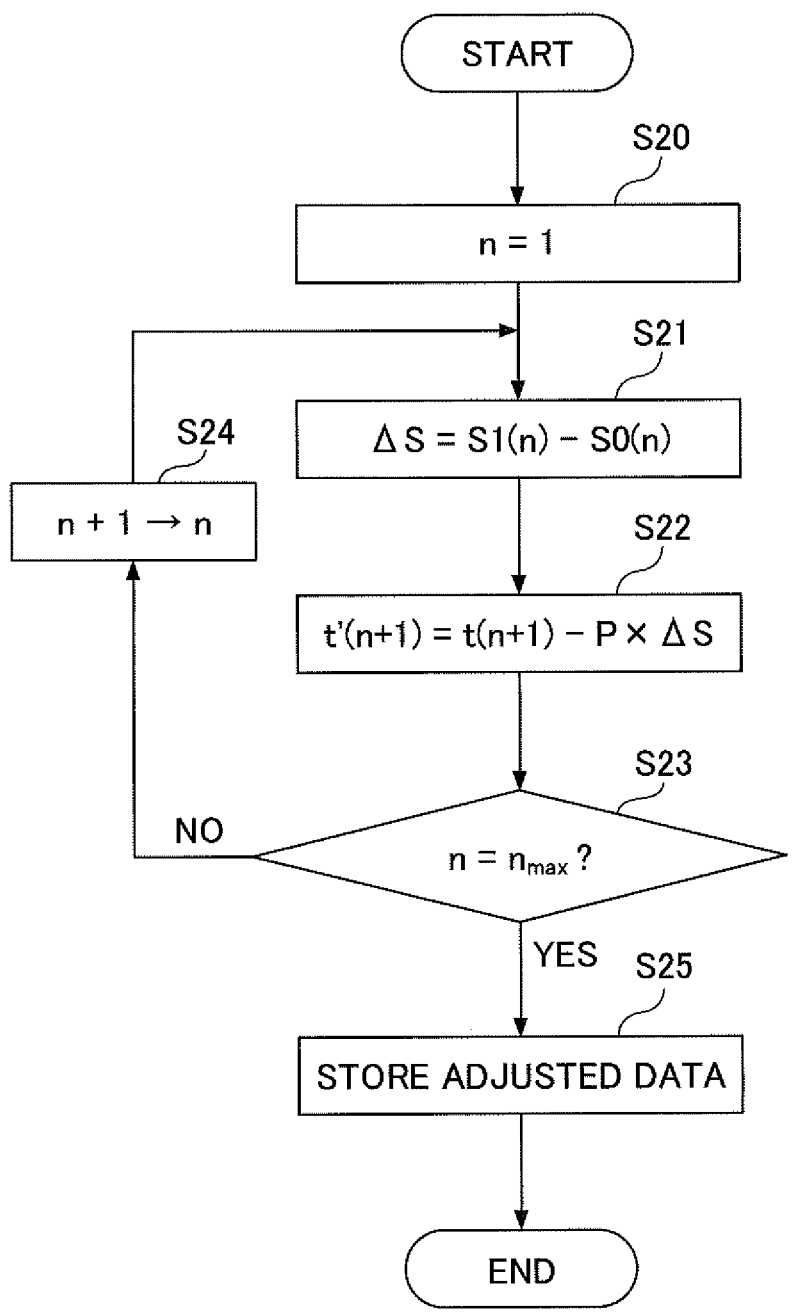
FIG. 7 is a flowchart for explaining an example of an adjustment process of an irradiation timing signal according to a first modification.

FIG. 7 is a flowchart illustrating an example of an adjustment process of an irradiation timing signal according to the first modification. As illustrated in FIG. 7, when the adjustment process starts, the irradiation-timing adjusting unit 112 first sets the parameter n to "1" (step S20), as is the case with the first embodiment. Then, the irradiation-timing adjusting unit 112 calculates a difference ΔS at time t(1) between the sensor output S1(n) and the sensor output S0(n).

Then, the irradiation-timing adjusting unit 112 subtracts, from the time t (n+1), a value obtained by multiplying the difference ΔS by a predetermined proportion-gain coefficient P, and sets the value after subtraction, as an adjusted time t' (n+1) (step S22). The proportion-gain coefficient P is appropriately set based on the relationship between the sensor output and the time.

Subsequently, as is the case with the first embodiment, the irradiation-timing adjusting unit 112 determines whether "$n=n_{max}$" is satisfied (step S23). When "$n<n_{max}$" (NO in step S23), the irradiation-timing adjusting unit 112 adds "1" to the parameter n (step S24), and returns the process to step S21. In other words, the irradiation-timing adjusting unit 112 repeats the process in step S21 and step S22 until "$n=n_{max}$" is satisfied.

In step S23, when "$n=n_{max}$" is determined to be satisfied (YES in the step), the irradiation-timing adjusting unit 112 stores, by using the irradiation timing signal, the time t(1) and the adjusted time t'(n) (where, n=2 to $n_{max}$) in the irradiation timing storage 113 (step S18), and then the adjustment process is finished.

As described above, according to the present modification, the irradiation timing (irradiation-time interval) is adjusted using the value corresponding to the difference between the measured value and the theoretical value of the sensor output. Thereby, a given dot position can be adjusted more accurately.

Second Modification of the First Embodiment

Hereafter, a second modification of the embodiment will be described. According to the embodiment that has been described above, the mirror drive circuit 12 drives the mirror 31 based on the drive voltage having the triangular waveform as illustrated in FIG. 3A. However, according to the second modified embodiment, a drive voltage having a distorted waveform that is a distorted triangular waveform, as illustrated in FIG. 8, is used to compensate for deviation from the theoretical values of the sensor output.

Figure 8:
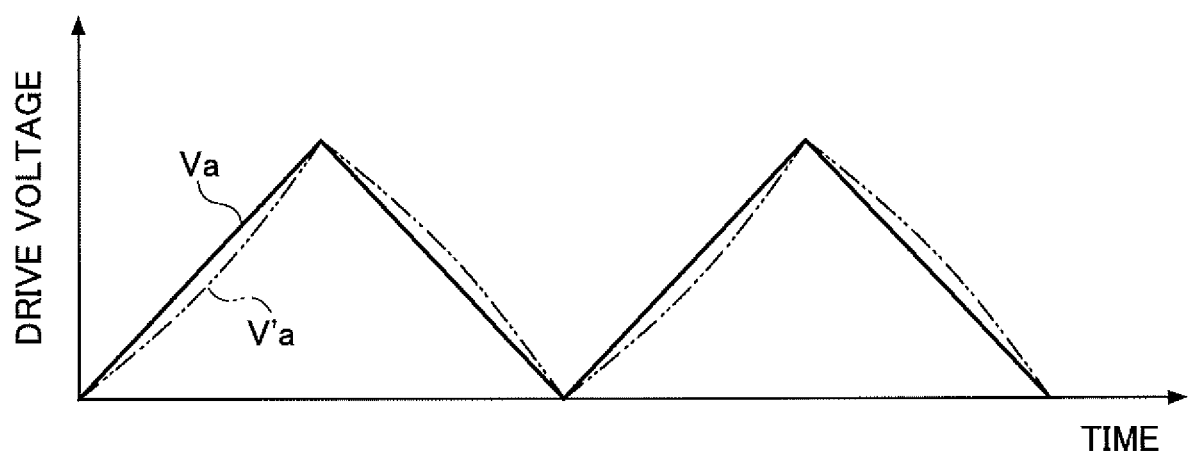
FIG. 8 is a diagram illustrating an example of a drive voltage having a distorted waveform used in a second modification.

In FIG. 8, the wave V'a represents a distorted wave for which the triangular wave Va illustrated in FIG. 3A is distorted. Note that in FIG. 8, a distorted wave for which the triangular wave Vb illustrated in FIG. 3A is distorted is omitted.

As a result of the adjustment process of the irradiation timing signal described in the embodiment, for example, the irradiation-time interval of the laser light may be decreased excessively. In this regard, by using the distorted wave V'a illustrated in FIG. 8, the adjusted amount of the irradiation timing is reduced and thus the irradiation-time interval can be prevented from being decreased excessively.

Second Embodiment

Hereafter, a second embodiment of the present disclosure will be described.

According to the first and modified embodiments, the light scanning unit 30 is a uniaxial light scanning element that scans light in one-dimension in the Y direction. However, according to the present embodiment, the light scanning unit 30 is a biaxial light scanning element that scans light in two-dimension in the Y direction (first direction) and the X direction (second direction) that are perpendicular to each other.

Figure 9:
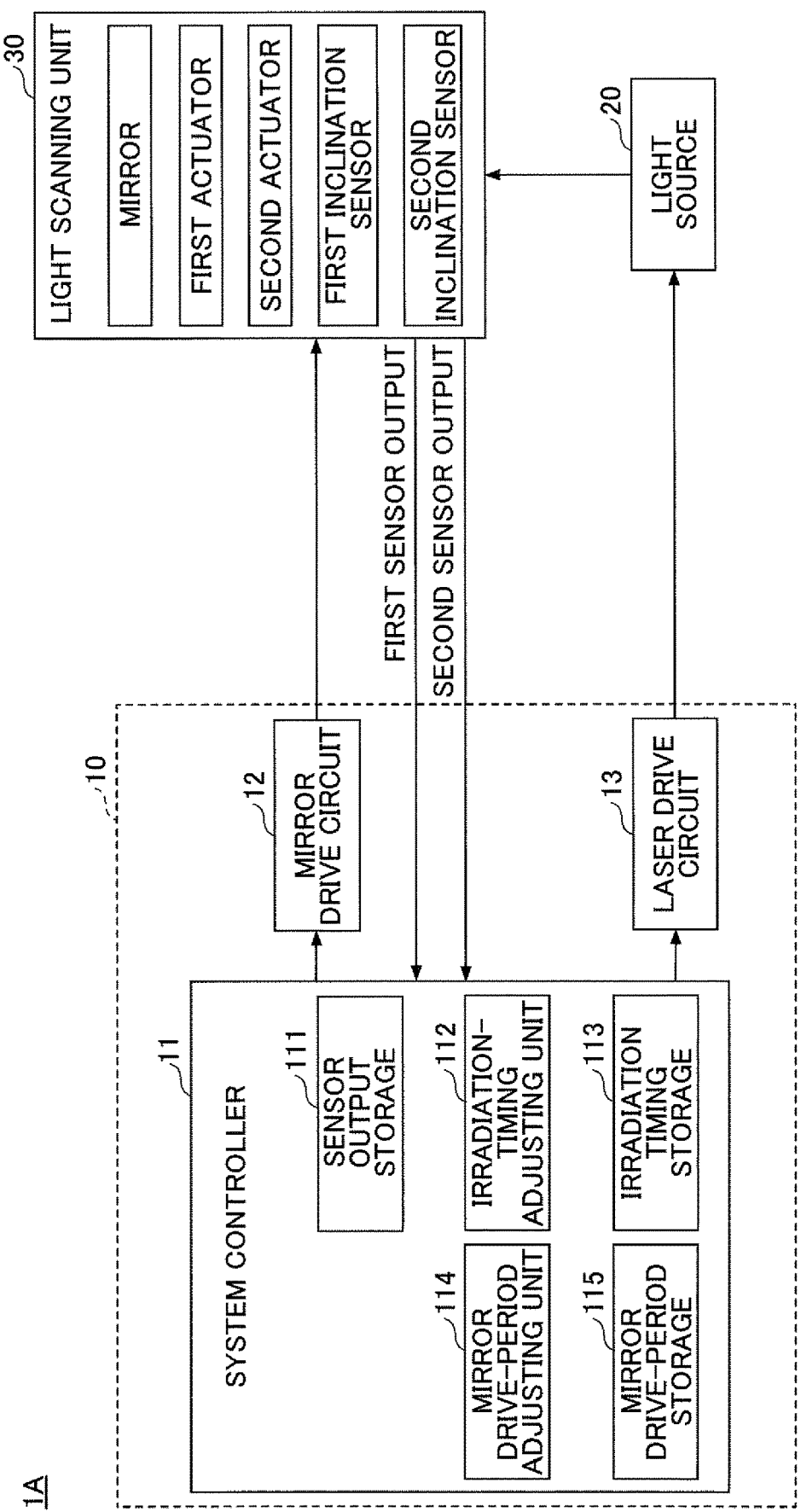
FIG. 9 is a diagram illustrating an example of the configuration of a light scanning apparatus according to a second embodiment.

FIG. 9 is a diagram illustrating an example of the configuration of a light scanning apparatus according to the second embodiment. As illustrated in FIG. 9, with respect to the light scanning apparatus 1A, the system controller 11 further includes functional units being a mirror drive-period adjusting unit 114 and a mirror drive-period storage 115.

According to the present embodiment, the light scanning unit 30 can scan with light in the Y direction while causing the mirror to oscillate about the oscillation axis AX parallel to the X direction, as well as scanning with light in the X direction while causing the mirror to oscillate about an oscillation axis AY parallel to the Y direction.

Tn this case, according to the present embodiment, the light scanning unit 30 includes first drive beams as a first actuator that causes the mirror to oscillate in the Y direction, and includes second drive beams as a second actuator that causes the mirror to oscillate in the X direction. The first drive beams have the same configurations as the drive beams 33A and 33B that have been described in the first embodiment. The second drive beams have configurations similar to the drive beams 33A and 33B as described in the first embodiment, where the second drive beams are formed in the portion of the mirror support 32 illustrated in FIG. 2, such that the second drive beams extend in a direction perpendicular to the direction in which the first drive beams extend.

Drive sources included in the first drive beams and drive sources included in the second drive beams are each non-resonantly driven by the mirror drive circuit 12. A first inclination sensor (which is the same as the inclination sensor 37 illustrated in FIG. 2) for measuring an inclination angle of the mirror in the Y direction is provided in a given first drive beam. A second inclination sensor for measuring an inclination angle of the mirror in the X direction is provided in a given second drive beam. The first inclination sensor and the second inclination sensor are respective examples of a first deflection sensor and a second reflection sensor.

Figure 10:
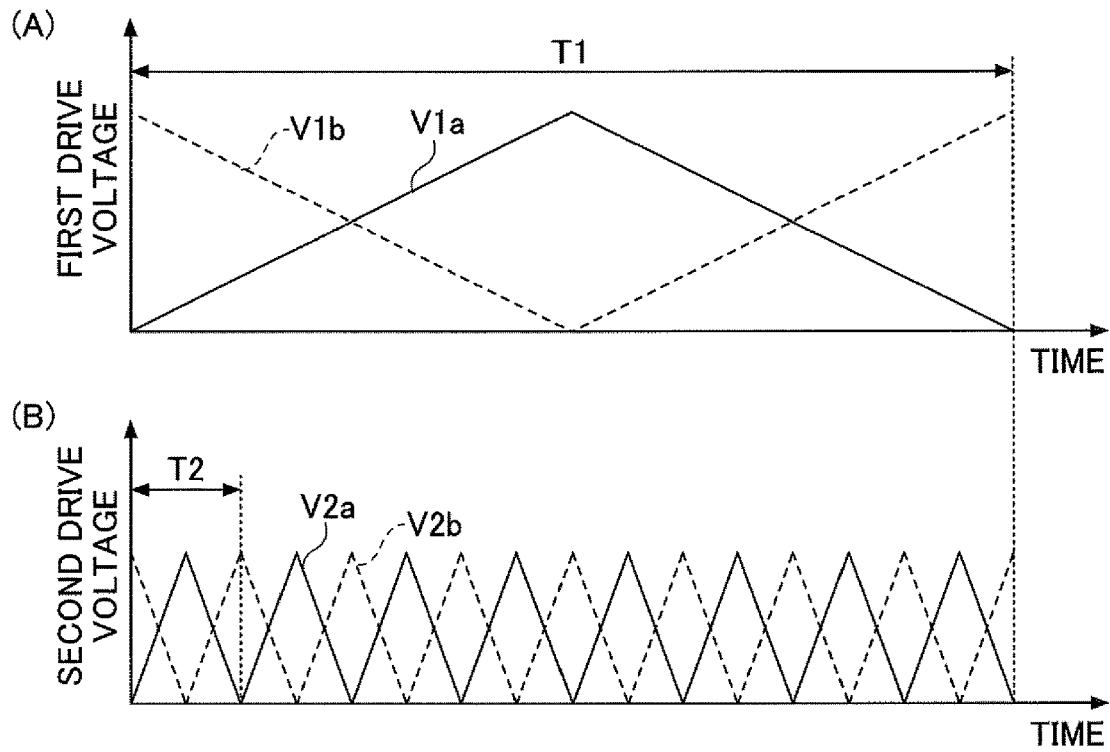
FIG. 10 is a diagram illustrating an example of first and second drive voltages supplied to the light scanning unit according to the second embodiment.

FIG. 10 is a diagram illustrating an example of first and second drive voltages supplied to the light scanning unit according to the second embodiment. FIG. 10(A) illustrates first drive voltages (first drive signals) supplied to the drive sources included in the first drive beams. In FIG. 10(A), the waves V1a and V1b represent respective triangular waves that are applied to adjacent drive sources, and of which phases are inverted with respect to each other. FIG. 10(B) illustrates second drive voltages (second drive signals) supplied to the drive sources included in the second drive beams. In FIG. 10(B), the waves V2a and V2b represent respective triangular waves that are applied to adjacent drive sources, and of which phases are inverted with respect to each other.

A first drive voltage period T1 is longer than a second drive voltage period T2, and the period T1 has a length of an integral multiple of the period T2. In the present embodiment, the mirror is driven at low speed and in the Y direction, where the oscillation axis AX is used as a low speed axis. Further, the mirror is driven at high speed in the X direction, where the oscillation axis AY is used as a high speed axis. In such a manner, the light scanning unit bidirectionally scans with light, such that the X direction is used as a main scanning direction; and the Y direction is used as a sub-scanning direction.

According to the present embodiment, the first sensor output of the first inclination sensor, as well as the sensor output of the second inclination sensor, are stored in the sensor output storage 111. Based on the sensor output of the second inclination sensor, the irradiation-timing adjusting unit. 112 adjusts irradiation timing (time interval) of the laser light, in the adjustment process described in the first embodiment. In this case, the irradiation-timing adjusting unit 112 adjusts the irradiation timing signal for emitting laser light, while the mirror is driven to oscillate at high-speed in the X direction, and stores the adjusted irradiation timing signal in the irradiation timing storage 113.

Figure 11:
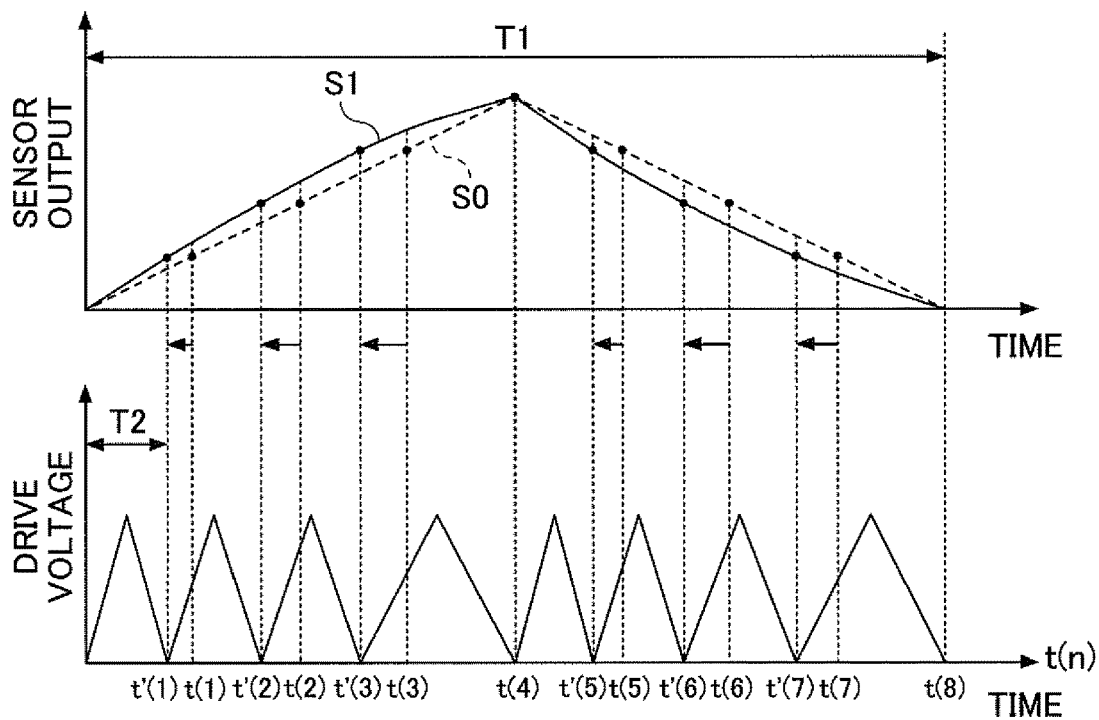
FIG. 11 is a diagram illustrating an example of a second drive voltage period adjusted based on non-linearity of the first sensor output.

Based on the first sensor output of the first inclination sensor, the mirror drive-period adjusting unit 114 adjusts the second drive voltage period T2 that is a drive period during which the mirror is driven at high speed, by the same method as described in the adjustment process according to the first embodiment. FIG. 11 illustrates the second drive voltage period T2 that is adjusted based on non-linearity of the first sensor output. The adjustment method of the second drive voltage period T2 is the same as described in the adjustment process according to the first embodiment, except that the adjusted time interval corresponds to the period T2. Such an adjustment method can be taken using any one from among the methods described in the first embodiment and the modifications thereof.

The mirror drive-period adjusting unit 114 stores the period T2 adjusted by the mirror drive-period adjusting unit 114. The mirror drive circuit 12 controls high speed driving of the mirror in the X direction, based on the period T2 stored in the mirror drive-period adjusting unit 114.

Note that in the present embodiment, because the period T2 is adjusted by the mirror drive-period adjusting unit 114, preferably, the irradiation-timing adjusting unit 112 adjusts the irradiation timing after the period T2 is adjusted by the mirror drive-period adjusting unit 114.

As described above, the light scanning apparatus 1A according to the present embodiment can accurately adjust the dot positions in both directions of the high speed axis and the low speed axis, when scanning light in two-dimension and in non-resonant drive.

Note that in each embodiment, as the light scanning unit, the light scanning element driven by a piezoelectric drive is used. However, the light scanning element is not limited to being driven using a piezoelectric drive, and a drive system such as an electrostatic drive or an electromagnetic drive may be employed.

The adjustment process performed by the irradiation-timing adjusting unit 112 and the mirror drive-period adjusting unit 114 is not limited to being implemented by a computer program in the system controller. The adjustment process may be performed by one or more logic circuits, or a Field-Programmable Gate Array (FPGA).

Each light scanning apparatus in the description can be applied to a device for measuring distances and ranging of an object, such as a LiDAR; or a projector (an ophthalmoscopy device, a vein recognition device, or the like) for diagnosing a human body or acquiring human body information.

One or more embodiments have been described above. However, the present disclosure is not limited to the aspects described in the embodiments. Modifications can be made within a scope of the present disclosure. Various aspects can be taken according to an application of a given light scanning apparatus.

What is claimed is:

1. A light scanning apparatus comprising:
a light source configured to intermittently emit light based on an irradiation timing signal, the irradiation timing signal being a signal indicating a timing at which the light source emits the light;
a mirror configured to reflect the light emitted by the light source;
an actuator configured to cause the mirror to be deflected based on drive signals;
a sensor configured to output a signal according to deflection of the mirror;
an irradiation timing adjusting-unit configured to adjust the irradiation timing signal based on the output signal of the sensor to change the timing at which the light source emits the light; and
an irradiation timing storage configured to store the adjusted irradiation timing signal,
wherein the irradiation timing adjusting-unit is configured to
compare an output signal of the sensor against a theoretical output signal to determine a difference between the output signal of the sensor and the theoretical output signal,
compare the determined difference against a threshold, and
adjust, in response to the difference being greater than the threshold, the irradiation timing signal based on the difference to change the timing at which the light source emits the light.

2. The light scanning apparatus according to claim 1, wherein the irradiation timing adjusting-unit is configured to adjust the irradiation timing signal based on a difference between a value of the output signal and a theoretical value, the theoretical value being determined based on a linearity of deflection of the mirror that changes according to the drive signals.

3. The light scanning apparatus according to claim 1, wherein the actuator includes piezoelectric elements, and wherein the drive signals are drive signals for driving the piezoelectric elements.

4. The light scanning apparatus according to claim 3, wherein each drive signal is a drive voltage having a triangular waveform.

5. The light scanning apparatus according to claim 3, wherein each drive signal is a drive voltage having a distorted triangular waveform.

6. A light scanning apparatus comprising:
a light source configured to intermittently emit light based on an irradiation timing signal, the irradiation timing signal being a signal indicating a timing at which the light source emits the light;
a mirror configured to reflect the light emitted by the light source;
a first actuator configured to cause the mirror to oscillate in a first direction, based on first drive signals;

a second actuator configured to cause the mirror to oscillate in a second direction, based on second drive signals, the second direction being perpendicular to the first direction;

a first sensor configured to output a signal according to deflection of the mirror in the first direction;

a second sensor configured to output a signal according to deflection of the mirror in the second direction;

a mirror drive-period adjusting unit configured to adjust a drive period of the second drive signals, based on the output signal of the first sensor;

an irradiation-timing adjusting unit configured to adjust the irradiation timing signal, based on the output signal of the second sensor, to change the timing at which the light source emits the light;

a mirror drive-period storage configured to store the adjusted drive period; and an irradiation timing storage configured to store the adjusted irradiation timing signal, wherein the irradiation-timing adjusting unit is configured to compare an output signal of the sensor against a theoretical output signal to determine a difference between the output signal of the sensor and the theoretical output signal, compare the determined difference against a threshold, and adjust, in response to the difference being greater than the threshold, the irradiation timing signal based on the difference to change the timing at which the light source emits the light.

7. The method of controlling the light scanning apparatus according to claim 6, the method comprising:

adjusting the drive period of the second drive signals based on the output signal of the first sensor to reduce misalignment of the light reflected by the mirror, the misalignment being caused by non-linearity of the mirror that is deflected according to the first drive signals; and adjusting the irradiation timing signal based on the output signal of the second sensor to change the timing at which the light source emits the light, so that misalignment of the light reflected by the mirror is reduced, the misalignment being caused by non-linearity of the mirror that is deflected according to the second drive signals.

8. A method of controlling a light scanning apparatus, the light scanning apparatus including:

a light source configured to intermittently emit light based on an irradiation timing signal, the irradiation timing signal being a signal indicating a timing at which the light source emits the light;

a mirror configured to reflect the light emitted by the light source;

an actuator configured to cause the mirror to be deflected based on drive signals; and a sensor configured to output a signal according to deflection of the mirror, the method comprising:

emitting the light based on the irradiation timing signal;

outputting the signal according to the deflection of the mirror; and adjusting the irradiation timing signal based on the output signal of the sensor to change the timing at which the light source emits the light, so that misalignment of the light reflected by the mirror is reduced, the misalignment being caused by non-linearity of the mirror that is deflected according to the drive signals, wherein the adjusting of the irradiation timing signal includes comparing an output signal of the sensor against a theoretical output signal to determine a difference between the output signal of the sensor and the theoretical output signal, comparing the determined difference against a threshold, and adjusting, in response to the difference being greater than the threshold, the irradiation timing signal based on the difference to change the timing at which the light source emits the light.

* * * * *